(12) United States Patent
Lee et al.

(10) Patent No.: US 10,373,946 B2
(45) Date of Patent: *Aug. 6, 2019

(54) DIODE-TRIGGERED SCHOTTKY SILICON-CONTROLLED RECTIFIER FOR FIN-FET ELECTROSTATIC DISCHARGE CONTROL

(71) Applicant: GLOBALFOUNDRIES INC., Grand Cayman (KY)

(72) Inventors: Chien-Hsin Lee, Malta, NY (US); Mahadeva Iyer Natarajan, Clifton Park, NY (US); Manjunatha Prabhu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 16/038,532

(22) Filed: Jul. 18, 2018

(65) Prior Publication Data

US 2018/0323185 A1  Nov. 8, 2018

Related U.S. Application Data

(63) Continuation of application No. 15/423,006, filed on Feb. 2, 2017, now Pat. No. 10,083,952.

(51) Int. Cl.
*H01L 27/02* (2006.01)
*H01L 29/78* (2006.01)
*H01L 29/74* (2006.01)
*H01L 29/861* (2006.01)
*H01L 29/06* (2006.01)

(52) U.S. Cl.
CPC ...... *H01L 27/0262* (2013.01); *H01L 29/0649* (2013.01); *H01L 29/742* (2013.01); *H01L 29/785* (2013.01); *H01L 29/861* (2013.01)

(58) Field of Classification Search
CPC . H01L 27/0262; H01L 29/742; H01L 29/785; H01L 29/87
See application file for complete search history.

(56) References Cited

U.S. PATENT DOCUMENTS

| 4,827,321 A | * | 5/1989 | Baliga | H01L 29/0834 |
| | | | | 257/133 |
| 5,093,705 A | * | 3/1992 | Voss | H01L 29/1016 |
| | | | | 257/129 |
| 5,545,905 A | * | 8/1996 | Muraoka | H01L 29/7392 |
| | | | | 257/136 |
| 5,739,044 A | * | 4/1998 | Terasawa | H01L 29/66356 |
| | | | | 257/E21.362 |

(Continued)

*Primary Examiner* — Sitaramarao S Yechuri
(74) *Attorney, Agent, or Firm* — Francois Pagette; Hoffman Warnick LLC

(57) ABSTRACT

Various embodiments include fin-type field effect transistor (FinFET) structures. In some cases, a FinFET structure includes: a p-type substrate; a silicon-controlled rectifier (SCR) over the p-type substrate, the SCR including: a p-well region and an adjacent n-well region over the substrate; and a negatively charged fin over the p-well region; and a Schottky diode electrically coupled with the SCR, the Schottky diode including a gate in the n-well region, the Schottky diode positioned to mitigate electrostatic discharge (ESD) across the negatively charged fin and the n-well region in response to application of a forward voltage across the gate.

11 Claims, 2 Drawing Sheets

(56) References Cited

U.S. PATENT DOCUMENTS

| | | | | |
|---|---|---|---|---|
| 10,083,952 B2* | 9/2018 | Lee | | H01L 27/0262 |
| 2005/0161743 A1* | 7/2005 | Voldman | | H01L 27/0259 257/360 |
| 2006/0238937 A1* | 10/2006 | Esmark | | H01L 27/0255 361/56 |
| 2010/0283529 A1* | 11/2010 | Zhang | | H01L 25/18 327/440 |
| 2011/0207409 A1* | 8/2011 | Ker | | H01L 27/0262 455/63.1 |
| 2012/0049279 A1* | 3/2012 | Shrivastava | | H01L 27/0727 257/347 |
| 2012/0319164 A1* | 12/2012 | Inaba | | H01L 29/66393 257/173 |
| 2013/0229223 A1* | 9/2013 | Shrivastava | | H01L 29/102 327/438 |
| 2014/0145213 A1* | 5/2014 | Henning | | H01L 29/8611 257/77 |
| 2015/0076522 A1* | 3/2015 | Zhang | | H01L 29/1608 257/77 |
| 2015/0076557 A1* | 3/2015 | Salcedo | | H01L 27/0262 257/173 |
| 2015/0144997 A1* | 5/2015 | Shrivastava | | H01L 29/102 257/173 |
| 2015/0187749 A1* | 7/2015 | Dai | | H01L 29/7436 257/173 |
| 2015/0295088 A1* | 10/2015 | Tsai | | H01L 29/7391 257/401 |
| 2015/0333191 A1* | 11/2015 | Henning | | H01L 29/8611 257/475 |
| 2016/0056146 A1* | 2/2016 | Li | | H01L 27/0259 257/133 |
| 2016/0056147 A1* | 2/2016 | Li | | H01L 27/0262 257/173 |
| 2017/0125399 A1* | 5/2017 | Huang | | H01L 27/0262 |
| 2017/0194487 A1* | 7/2017 | Chen | | H01L 29/0649 |

* cited by examiner

DIODE-TRIGGERED SCHOTTKY SILICON-CONTROLLED RECTIFIER FOR FIN-FET ELECTROSTATIC DISCHARGE CONTROL

BACKGROUND

The subject matter disclosed herein relates to integrated circuit devices. More particularly, the subject matter relates to circuits for managing electrostatic discharge (ESD) in fin-type field effect transistor (FinFET) structures.

As integrated circuit technology has evolved, circuit devices, including process-technology used to make those devices, has become ever smaller. Crowding of circuitry in these advanced devices increases the incidence of ESD, or the discharge of static electricity from a body surface to a device. ESD concerns are relevant to both manufacturing processes used in forming integrated circuit devices, as well as in the end-user environment, where haptics have increased the level of interaction between users and devices.

SUMMARY

Various embodiments of the disclosure include fin-type field effect transistor (FinFET) structures. In a first aspect, a FinFET structure includes: a substrate; a silicon-controlled rectifier (SCR) over the substrate, the SCR including: a p-well region and an adjacent n-well region over the substrate; and a negatively charged fin over the p-well region; and a Schottky diode electrically coupled with the SCR, the Schottky diode spanning between the p-well region and the n-well region, the Schottky diode for controlling electrostatic discharge (ESD) across the negatively charged fin and the n-well region.

A second aspect of the disclosure includes a fin-type field effect transistor (FinFET) structure having: a p-type substrate; a silicon-controlled rectifier (SCR) over the p-type substrate, the SCR including: a p-well region and an adjacent n-well region over the substrate; and a negatively charged fin over the p-well region; and a Schottky diode electrically coupled with the SCR, the Schottky diode spanning between the p-well region and the n-well region and including a gate in the n-well region, the Schottky diode positioned to mitigate electrostatic discharge (ESD) across the negatively charged fin and the n-well region in response to application of a forward voltage across the gate.

A third aspect of the disclosure includes a fin-type field effect transistor (FinFET) structure having: a p-type substrate; a silicon-controlled rectifier (SCR) over the p-type substrate, the SCR including: a p-well region and an adjacent n-well region over the substrate; and a negatively charged fin over the p-well region; and a Schottky diode electrically coupled with the SCR, the Schottky diode including a gate in the n-well region, the Schottky diode positioned to mitigate electrostatic discharge (ESD) across the negatively charged fin and the n-well region in response to application of a forward voltage across the gate.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
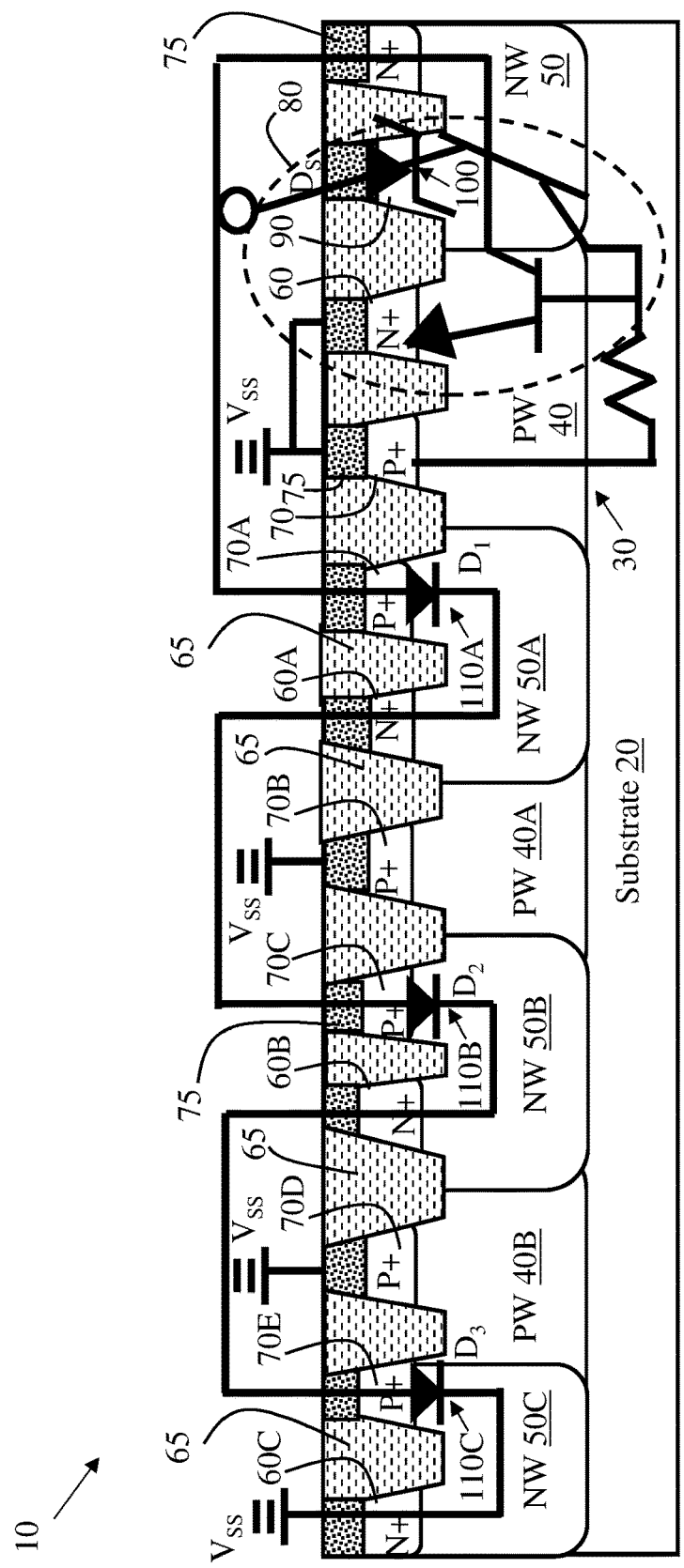
FIG. 1 shows a schematic cross-sectional view of a fin-type field effect transistor (FinFET) structure according to various embodiments of the disclosure.

It is noted that the drawing of the invention is not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuits (ICs). More particularly, the subject matter relates to structures for controlling electrostatic discharge (ESD) in fin-type field effect transistors (FinFETS).

In the following description, reference is made to the accompanying drawings that form a part thereof, and in which specific embodiments are shown by way of illustration. These embodiments are described in sufficient detail to enable those skilled in the art to practice the present teachings and it is to be understood that other embodiments may be utilized and that changes may be made without departing from the scope of the present teachings. The following description is, therefore, merely illustrative.

The ICs disclosed according to various embodiments of the disclosure, which includes a Schottky silicon-controlled rectifier (SCR), are configured to protect FinFET devices from ESD. In particular, the ICs disclosed according to various embodiments of the disclosure include a diode trigger for actuating the Schottky SCR in order to control ESD in a FinFET.

FIG. 1 shows a schematic cross-sectional view of a fin-type field effect transistor (FinFET) structure 10. In various embodiments, FinFET structure 10 includes a substrate 20, which may be formed at least partially of silicon (Si), but in some embodiments, may include silicon dioxide or other silicon-based substrate materials. In various embodiments, substrate 20 is a p-type doped material, e.g., a positively doped substrate material such as silicon, silicon dioxide, etc. Over substrate 20 is a silicon-controlled rectifier (SCR) 30, which may include a p-well region (PW) 40 and an n-well region (NW) 50 adjacent p-well region 40. P-well region 40 can include a doped semiconductor material, which may include silicon dioxide, organic polymeric dielectrics (e.g., polyimide, polynorbornenes, benzocyclobutene, and PTFE), spin-on polymeric dielectrics (e.g., hydrogen silsesquioxane (HSQ) and methylsilsesquioxane (MSQ)), additional oxides such as hafnium oxide (HfOx), zinc oxide (ZnOx), aluminum oxide (Al2O3), etc., or other semiconductor-based circuit layers such as III-V gallium arsenic (GaAs), gallium antimony (GaSb). The semiconductor material in p-well region 40 can be positively doped, e.g., with ions of boron and/or $BF_2$ (boron-fluorine).

N-well region 50 can include a doped semiconductor material, which may include silicon dioxide, organic polymeric dielectrics (e.g., polyimide, polynorbornenes, benzocyclobutene, and PTFE), spin-on polymeric dielectrics (e.g., hydrogen silsesquioxane (HSQ) and methylsilsesquioxane (MSQ)), additional oxides such as hafnium oxide (HfOx), zinc oxide (ZnOx), aluminum oxide ($Al_2O_3$), etc., or other semiconductor-based circuit layers such as III-V gallium arsenic (GaAs), gallium antimony (GaSb). The semiconductor material in n-well region 50 can be negatively doped, e.g., with ions of arsenic and/or phosphorus.

P-well region 40 and n-well region 50 create a P-N junction overlying substrate 20. Further, n-well region 50 and substrate 20 create an additional P-N junction. Overlying p-well region 40 is a negatively charged fin 60, which may be formed of any semiconductor material discussed herein or known in the art. Negatively charged fin 60 is negatively doped, e.g., with ions of arsenic and/or phosphorus, to create a P-N junction between negatively charged fin 60 and p-well region 40. A positively charged fin 70 can also be located over p-well region 40, which may be formed of any semiconductor material discussed herein or known in the art. Positively charged fin 70 is positively doped, e.g., with ions of boron and/or $BF_2$ (boron-fluorine).

Also shown in FinFET structure 10 are additional p-well regions 40A, 40B (e.g., first additional p-well region, second additional p-well region, etc.) and additional n-well regions 50A, 50B, 50C (e.g., first additional n-well region, second additional n-well region, etc.). FinFET structure 10 can also include additional negatively charged fins 60A, 60B, 60C and additional positively charged fins 70A, 70B, 70C, 70D, 70E overlying the additional p-well regions 40A, 40B and additional n-well regions 50A, 50B, 50C. Between adjacent fins 60, 70 are insulator regions 65, which may include any conventional IC insulator material, e.g., an oxide such as silicon dioxide, hafnium oxide ($HfO_x$), zinc oxide ($ZnO_x$), aluminum oxide ($Al_2O_3$), etc. Additionally, fins 60, 70 can include contact regions 75, which may include one or more conventional contact metals used in IC technology, e.g., copper, aluminum, tungsten, titanium, nickel, etc., and/or alloys thereof. Contact regions 75 can be used to apply a voltage to the FinFET 10, in order to control ESD, as described herein.

FinFET structure 10 can further include a Schottky diode 80 spanning between p-well region 40 and n-well region 50. Schottky diode 80 can be configured to control elelectrostatic discharge (ESD) across negatively charged fin 60 and n-well region 50. In various embodiments, Schottky diode 80 extends through a fin 90 (having a contact region 75) overlying n-well region 50, into n-well region 50. Fin 90 can include a metal such as molybdenum, platinum, chromium or tungsten, or certain silicides (e.g., palladium silicide and platinum silicide), and may be doped, e.g., with arsenic and/or phosphorous, to act as an anode region of a Schottky diode. A portion of fin 90 can extend from N-well region 50, which can act as the cathode region of Schottky diode 80. As illustrated in the schematic depiction of FinFET structure 10 in FIG. 1, the gate 100 of Schottky diode 80 can be located in n-well region 50.

Schottky diode 80 is electrically coupled with SCR 30, which may include a P-N-P-N switch. The P-N-P-N switch of SCR can include (p-type) substrate 20, n-well region 50, p-well region 40, and negatively charged fin 60. As shown and described herein, Schottky diode 80 is connected in series with three (additional) diodes 110A, 110B, 110C, located within additional n-well regions 50A, 50B, 50C, respectively. In particular, the three additional diodes 110A, 110B, 110C can include an anode in positively charged fins 70A, 70C, 70E over n-well regions 50A, 50B and 50C, respectively, and a cathode in each of those n-well regions 50A, 50B, 50C.

In various embodiments, Schottky diode 80 is configured to control ESD within FinFET structure 10. More particularly, Schottky diode 80 is positioned to mitigate (e.g., minimize or eliminate) ESD across negatively charged fin 60 and n-well region 50 in response to application of a forward voltage to gate 100. That is, when a forward voltage is applied to gate 100, e.g., via fin 90, Schottky diode 80 allows for comparable current flow at a reduced temperature when compared with a conventional diode, due to its lower forward voltage. Additionally, due to its higher switching frequency, Schottky diode 80 can allow for greater switching control relative to a conventional diode and greater ESD protection.

The design of FinFET structure 10 can utilize several principles of ESD protection. In particular, ESD originates outside of the chip. The first component that ESD faces in the chip is the first stage ESD protection device. As such, most ESD is dissipated by this first stage ESD device (or, primary ESD device). The second stage, third stage and fourth stage ESD devices are the trigger device. In various embodiments of the disclosure, the Schottky diode 80 is located at the first stage of ESD protection to form the SCR, because the SCR can sink the high ESD current and clamp the ESD at very low voltage due to its characteristic as a low turn-on (switching) resistor. The diode string including diodes 110A, 110B, 110C has a large turn-on resistor, along with a high operation voltage at a high current level. As such, the diode string 110, 110B, 110C may struggle to clamp the ESD voltage at a low voltage. Additionally, too high of a voltage may damage the protected device. As such, according to various embodiments, the diode string (diodes 110A, 110B, 110C) is used as a trigger device. As the Schottky diode 80 (including the SCR) is triggered on by the diode string 110A, 110B, 110C, most current will flow through the Schottky diode 80 (including the SCR) as its operation voltage is smaller than that of the diode string 110A, 110B, 110C (trigger device).

In some cases, Schottky diode 80 has a forward voltage of approximately 150 mili-Volts (mV) to approximately 450 mV, which can be lower than the forward voltage for additional diodes 110A, 110B, 110C (e.g., having forward voltages between approximately 150 mV to approximately 500 mV).

Figure 2:
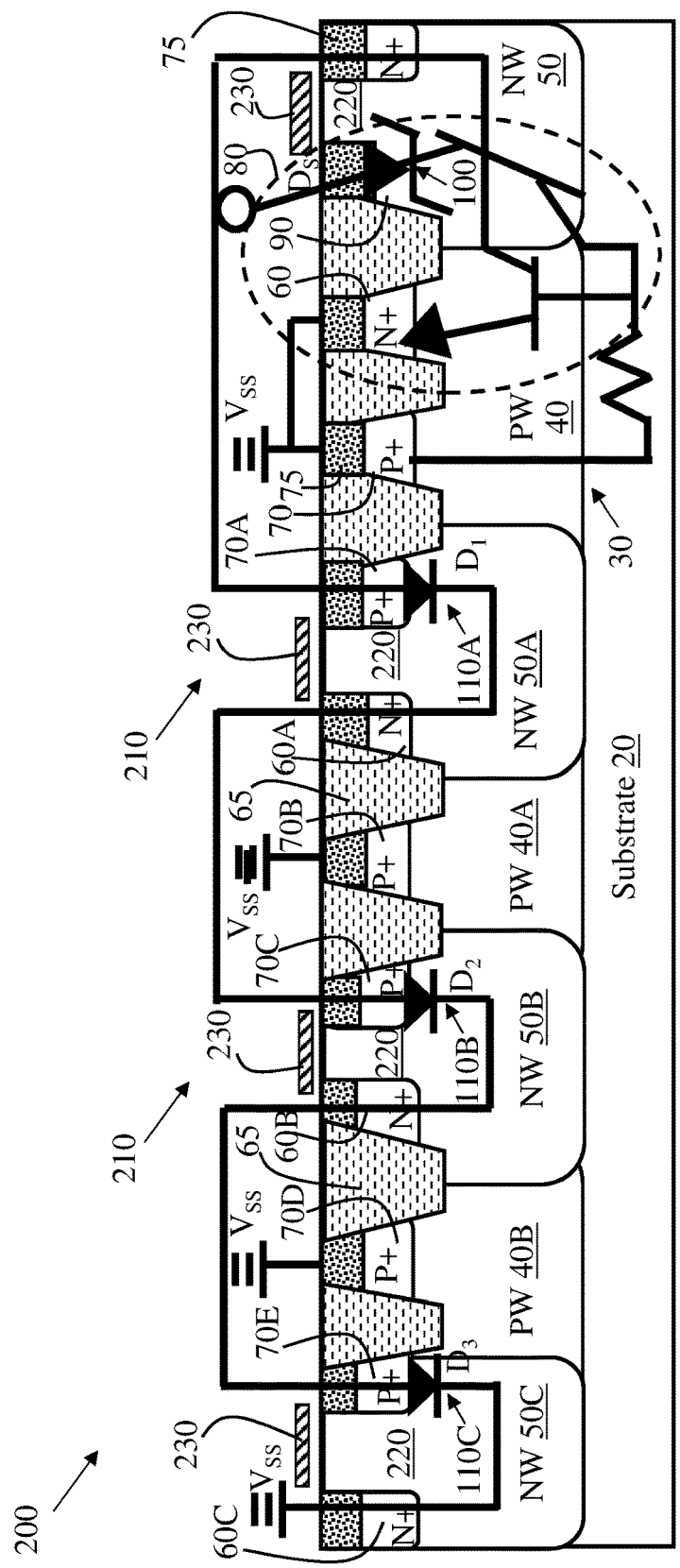
FIG. 2 shows a schematic cross-sectional view of a FinFET structure according to various additional embodiments of the disclosure.

FIG. 2 shows another embodiment of a FinFET structure 200 that includes gated diodes 210, which include shallow trench isolations (STIs) 220 and corresponding gates 230 in Schottky diode 80 and additional diodes 110A, 110B, 110C. These gated diodes 210 can be controlled via voltage applied to gates 230, which can be located over STIs 220. In some cases, STIs extend from N-well regions 50, 50A, 50B, 50C.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A fin-type field effect transistor (FinFET) structure comprising:
   a p-type substrate;
   a silicon-controlled rectifier (SCR) over the p-type substrate, the SCR including:
      a p-well region and an adjacent n-well region over the substrate; and
      a negatively charged fin over the p-well region; and
   a Schottky diode electrically coupled with the SCR, the Schottky diode including a gate in the n-well region, the Schottky diode positioned to mitigate electrostatic discharge (ESD) across the negatively charged fin and the n-well region in response to application of a forward voltage across the gate,
   wherein the negatively charged fin acts as an anode region of the Schottky diode.

2. The FinFET structure of claim 1, wherein the SCR includes a P-N-P-N switch.

3. The FinFET structure of claim 2, wherein the P-N-P-N switch includes the p-type substrate, the n-well region, the p-well region and the negatively charged fin.

4. The FinFET structure of claim 1, further comprising a positively charged fin over the p-well region and an additional negatively charged fin over the n-well region.

5. The FinFET structure of claim 1, further comprising:
   a first additional n-well region adjacent the p-well region;
   a first additional p-well region adjacent the first additional n-well region;
   a second additional n-well region adjacent the first additional p-well region;
   a second additional p-well region adjacent the second additional n-well region; and
   a third additional n-well region adjacent the second additional p-well region.

6. The FinFET structure of claim 5, further comprising three diodes coupled in series with the Schottky diode.

7. The FinFET structure of claim 6, wherein each of the three diodes is located within the first additional n-well region, the second additional n-well region and the third additional n-well region, respectively.

8. The FinFET structure of claim 7, further comprising additional sets of negatively charged fins and positively charged fins over each of the first additional n-well region, the second additional n-well region, and the third additional n-well region.

9. The FinFET structure of claim 8, wherein each of the three diodes includes an anode in the additional positively charged fin over the first, second and third additional n-well regions, and a cathode in each of the first, second and third additional n-well regions.

10. A fin-type field effect transistor (FinFET) structure comprising:
    a p-type substrate;
    a silicon-controlled rectifier (SCR) over the p-type substrate, the SCR including:
       a p-well region and an adjacent n-well region over the substrate;
       a negatively charged fin over the p-well region,
       wherein the SCR includes a P-N-P-N switch including the p-type substrate, the n-well region, the p-well region and the negatively charged fin; and
       a positively charged fin over the p-well region and an additional negatively charged fin over the n-well region; and
    a Schottky diode electrically coupled with the SCR, the Schottky diode including a gate in the n-well region, the Schottky diode positioned to mitigate electrostatic discharge (ESD) across the negatively charged fin over the p-well region and the n-well region in response to application of a forward voltage across the gate,
    wherein the negatively charged fin over the p-well region acts as an anode region of the Schottky diode.

11. The FinFET of claim 10, wherein the negatively charged fin over the p-well region includes a metal.

* * * * *